United States Patent [19]

Smith

[11] Patent Number: 4,956,736
[45] Date of Patent: Sep. 11, 1990

[54] THIN FILM MAGNETIC ELEMENT HAVING A RHOMBIC SHAPE

[75] Inventor: Neil Smith, San Diego, Calif.

[73] Assignee: Eastman Kodak Company, Rochester, N.Y.

[21] Appl. No.: 285,178

[22] Filed: Dec. 16, 1988

[51] Int. Cl.$^5$ .................. G11B 5/39; G01R 33/02; B32B 15/00

[52] U.S. Cl. .................... 360/113; 324/252; 428/681

[58] Field of Search ............ 360/113; 338/32 R; 324/252

[56] References Cited

U.S. PATENT DOCUMENTS

| | | | |
|---|---|---|---|
| 4,821,133 | 4/1989 | Mowry et al. | 360/113 |
| 4,841,398 | 6/1989 | Mowry | 360/113 |
| 4,891,725 | 1/1990 | Mowry | 360/113 |

*Primary Examiner*—Robert S. Tupper
*Attorney, Agent, or Firm*—Daniel Robbins

[57] ABSTRACT

The present invention provides increased stabilization of the magnetization of a single domain thin magnetic film over that attainable in the rectangular thin film known in the prior art by shaping the magnetic film as a rhomboid rather than as a rectangle. Practice of the invention teaches angling the transverse sides of the film with respect to the longitudinal sides either at an angle equal to, or smaller than, the angle at the bias point of the magnetization with respect to the direction of the easy axis, as established by an external bias field. Under these conditions the biased magnetization of the film, being either parallel to, or at a positive angle with respect to the transverse sides of the rhomboid, either generates no charges at the transverse edges of the film, or actually generates charges which produce a field parallel to the longitudinal component of the magnetization which stabilizes the magnetization of the single domain rather than destabilizes it.

3 Claims, 5 Drawing Sheets

THIN FILM MAGNETIC ELEMENT HAVING A RHOMBIC SHAPE

BACKGROUND OF THE INVENTION

1. Field of the Invention

This invention relates to a thin film magnetic element having the shape of a rhomboid that stabilizers single domain film magnetization and results in reduced domain wall Barkhausen noise. The teachings of the invention may be applied to thin magnetic films in general, and to the magnetoresistive thin film in particular.

Figure 1:
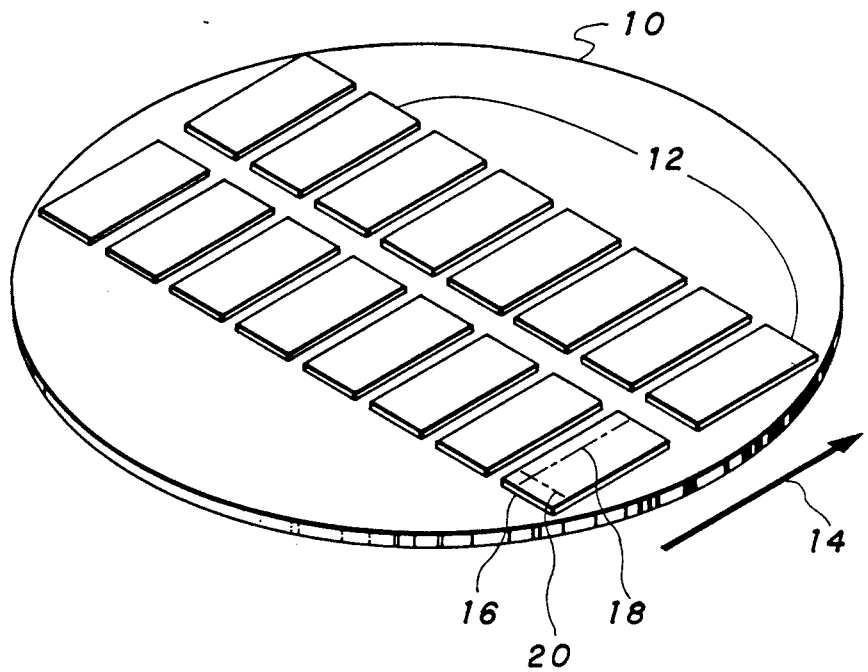
Figure 4:
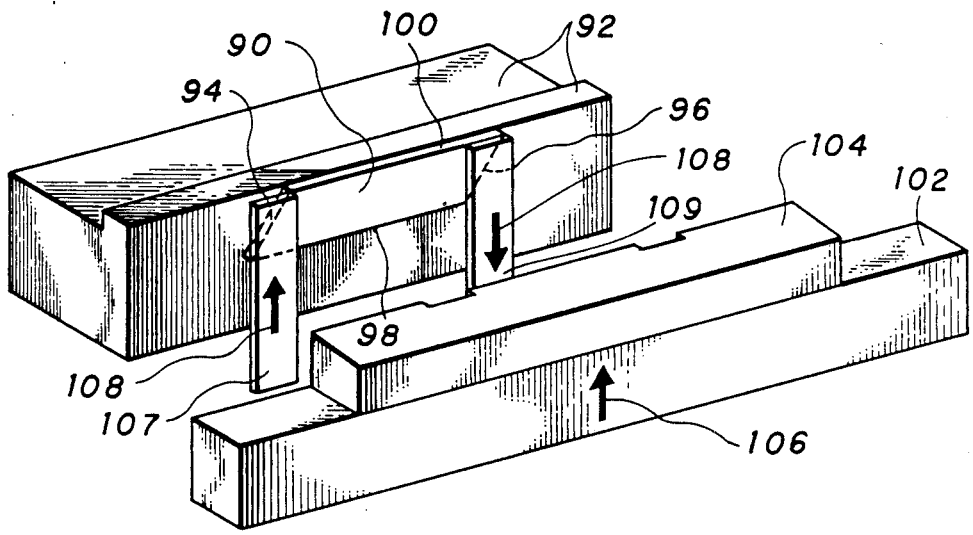
Figure 2A:
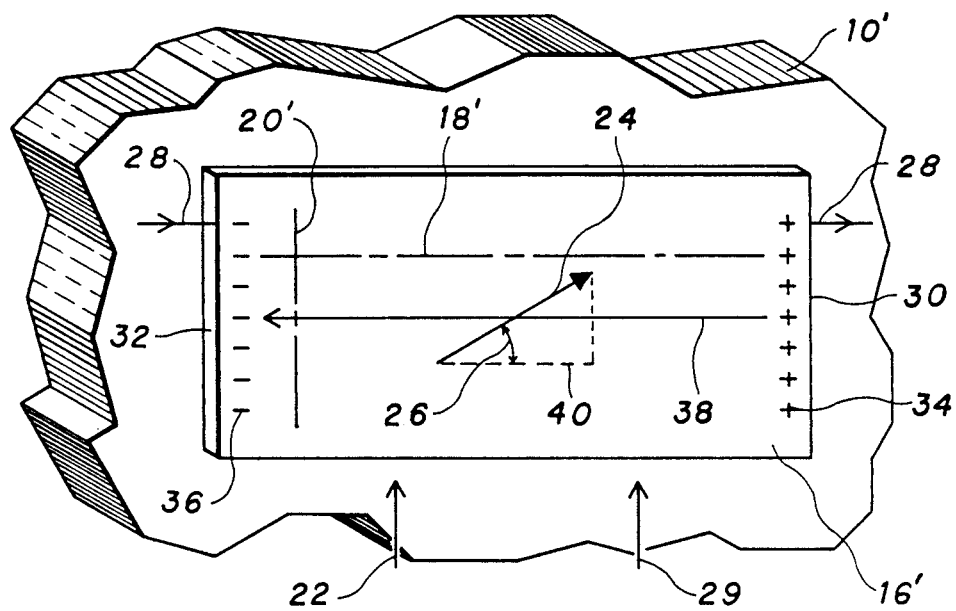
Figure 2B:
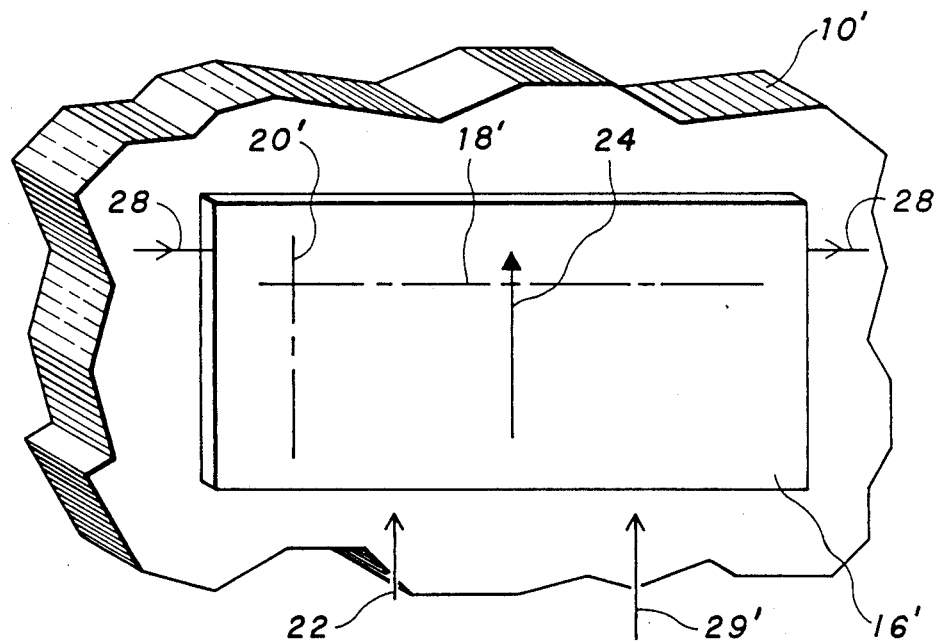
Figure 2C:
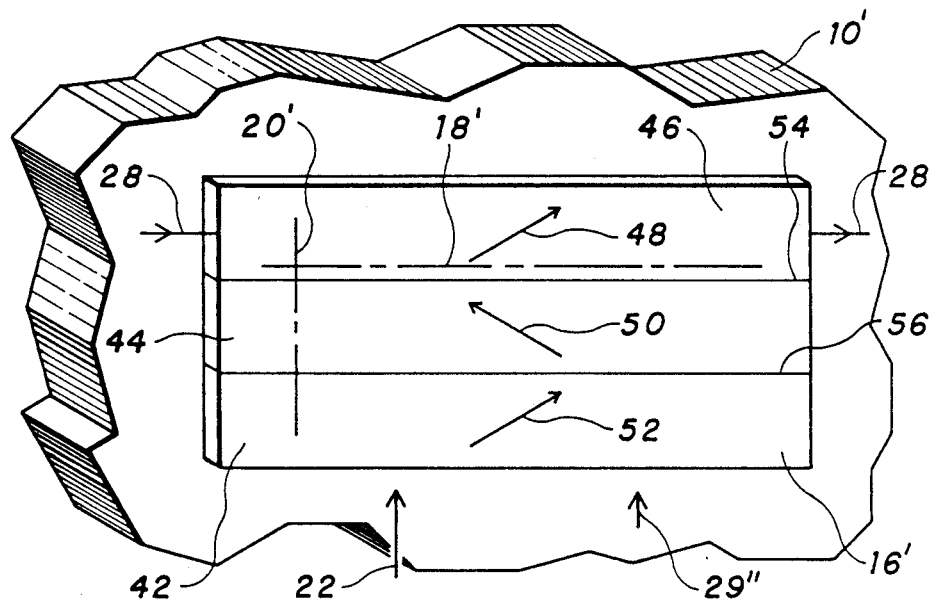
Figure 2D:
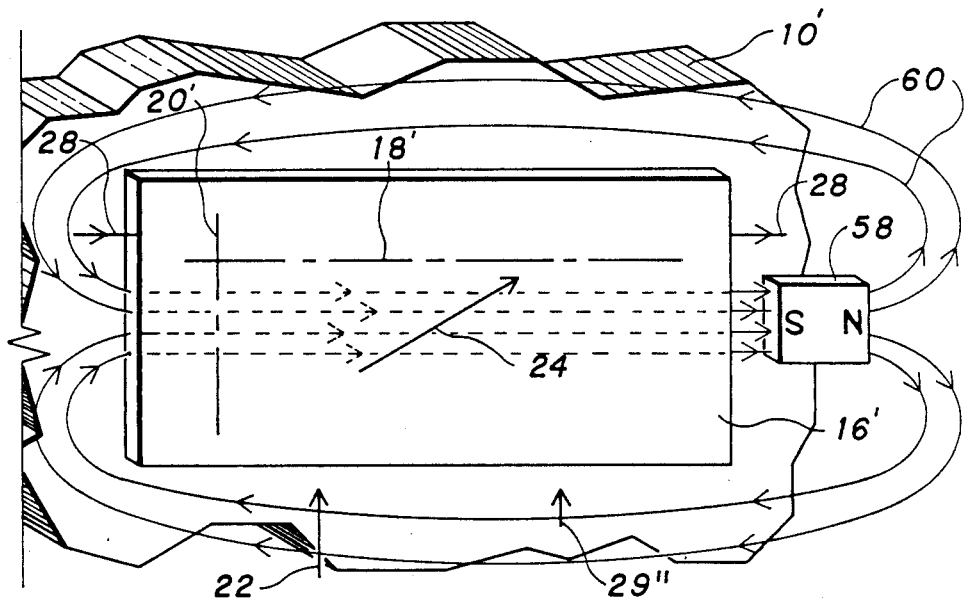
Figure 3A:
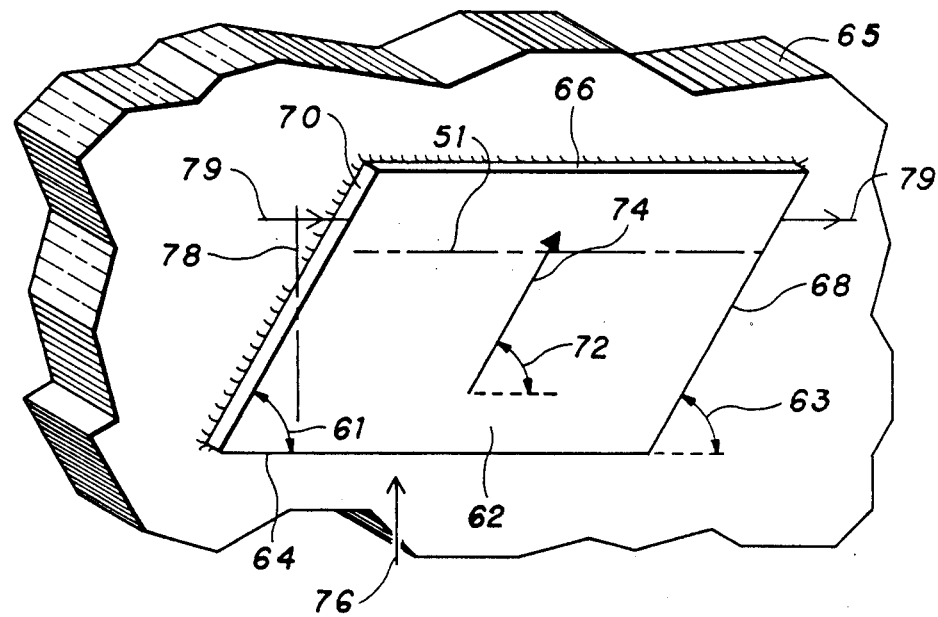
Figure 3B:
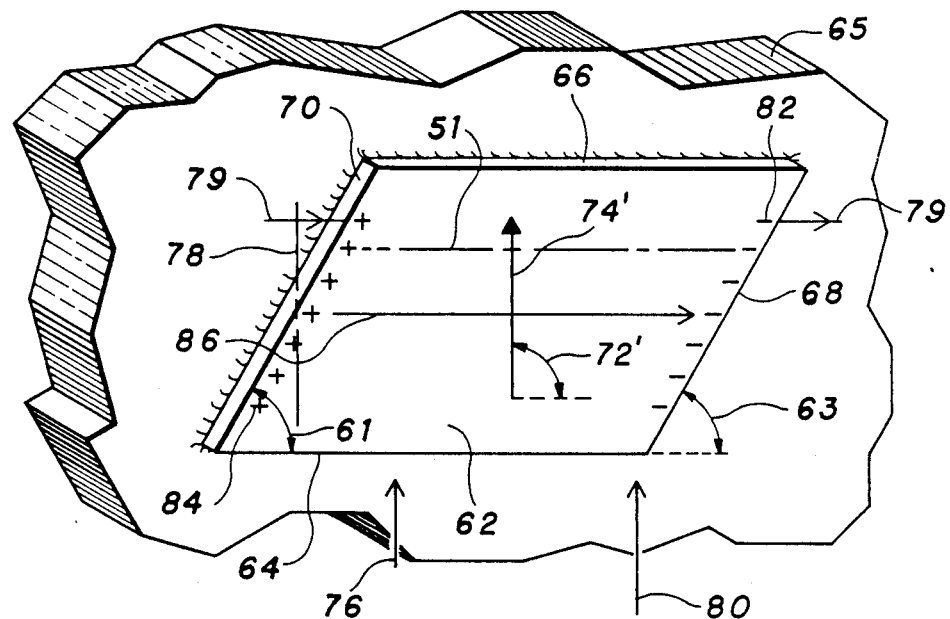
Figure 3C:
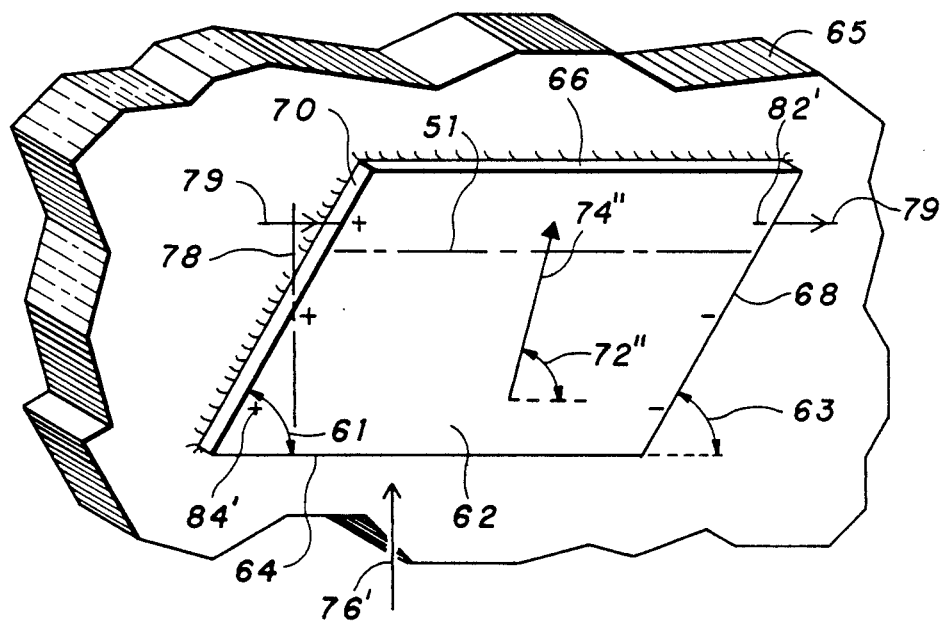

The invention, as well as the prior art, will be described with reference to the figures, of which:

FIG. 1 is a representation of rectangularly shaped thin film magnetoresistive elements deposited on a substrate as taught in the prior art, FIGS. 2a-2d are drawings illustrating the steps in the formation of multiple domains in a rectangularly shaped thin film magnetoresistive element, and a technique for preventing such formation, known in the prior art, FIGS. 3a-3c are drawings of a rhomboid shaped thin film magnetoresistive element according to the present invention illustrating immunity of such a film to formation of multiple domains, and FIG. 4 is an exploded view of a magnetoresistive reproduce head utilizing a thin film element in accordance with the present invention.

2. Description Relative to the Prior Art

The thin magnetic film is used in a variety of diverse applications, serving, for example, as a storage element in magnetic memories, as a soft adjacent biasing layer in magnetoresistive heads and as a recording medium in magneto-optic memories. An important and widely applied example of the thin magnetic film is the magnetoresistive film which has been extensively used for the detection of static and dynamic magnetic fields, and has been incorporated into low level magnetic reproduce heads and into sensitive magnetometers. The typical film of the prior art is rectangularly shaped, as disclosed, for example, in U.S. Pat. No. 3,493,694.

As is known in the art, multidomain magnetic films are subject to Barkhausen noise due to irregular domain wall motions and wall-state transitions in the film. It is therefor advantageous from a signal to noise (SNR) point of view to minimize the number of domains and, hence, domain walls with the attendant reduction of Barkhausen noise. Maintaining a single domain under a variety of operating conditions is an important desideratum in the application of thin magnetic film technology. Domain wall problems that arise in thin magnetic film applications are particularly well illustrated in the case of the magnetoresistive film, where its use as a low level magnetic field detector emphasizes the necessity of control of the film domain structure. The techniques for the control of domain formation in the magnetoresistive thin film are also applicable to domain control in other thin magnetic films.

Referring to FIG. 1, a magnetoresistive material, such as permalloy, is deposited as a thin film to a thickness of approximately 500 Angstroms on a wafer, which serves as a substrate 10. The deposition takes place in the presence of an auxiliary magnetic field 14. A series of element outlines 12 are then photolithographically patterned over the wafer and, in the prior art, these outlines are generally of rectangular shape. By means well known in the art, the thin magnetic film is removed from all portions of the surface of the substrate 10 except within the element outlines 12, leaving a series of magnetic elements, such as the typical element 16. Because the thin film is deposited in the presence of the auxiliary field 14, the element 16 has an "easy" axis defined by the direction of the magnetic field 14. The major geometric axis of the element 16 and its resultant "easy" axis 18 are oriented in the direction of the auxiliary field 14 during deposition. The element 16 also possesses a "hard" axis of magnetization 20 orthogonal to the "easy" axis orientation. After deposition, the substrate is diced out to provide individual magnetoresistive elements each having "easy" and "hard" axes defined by the direction of the auxiliary field 14.

The detection of an applied magnetic field by means of a single domain magnetoresistive element fabricated as described above may be appreciated by reference to FIG. 2a. The element 16', deposited on a substrate 10', is biased by an external magnetic field 22, aligned along the hard axis, which rotates the magnetization 24 from the preferred easy axis direction 18' through an angle 26, generally equal to about 45 degrees. Positive angular direction is defined, as viewed in the figures, as counterclockwise rotation from the easy axis 18'. (In the drawings, different but related elements are identified with the same reference number, albeit that such corresponding elements are distinguished in the various drawings by the use of primes.) The angle 26 sets the bias point for the magnetic operation of the element 16', and is chosen so that any additional rotation resulting from an applied signal field 29, also directed along the hard axis 20', results in an essentially linear change in magnetoresistance with the amplitude of the signal field 29. (The magnetization of a domain is a vector field existing throughout the entire domain, but for convenience it is represented in the figures as a single vector.) As is known in the art, variation of the angle 26 of the magnetization 24 of a magnetoresistive element resultantly changes the resistance of the element, and this change may be detected by passing a sense current 28 through the element 16' and measuring the voltage drop across the element 16'; the resulting incremental voltage being proportional to the signal field 29. It will be noted that due to the thinness of the element 16', the magnetization 24 is essentially constrained to the plane of the element 16'.

Over the range of applied signal fields, the magnitude of the change of resistance of a magnetoresistive element is only 2-3% of the static film resistance, and, therefore, a high SNR in the element is of prime importance. It is preferable that magnetoresistive elements remain as single magnetic domains, because, as is known in the art, the presence and subsequent movement of domain walls in a multidomain element generates Barkhausen noise detrimental to SNR. Often, however, the single domain structure tends to be more unstable than the multidomain structure, and the rectangular thin element is particularly prone to instability. One reason for this instability in the rectangular element may be understood by further reference to FIG. 2a. Recalling that the magnetization 24 is approximately at 45 degrees with respect to the easy axis 18', it is clear that because the element 16' is a rectangle, the magnetization 24 is also at an angle of 45 degrees with respect to the element edges 30, 32. It is known in the art, that at the interface between a magnetic material of magnetization M and a non-magnetic material, magnetic charges are generated of magnitude equal to the vector "dot" product, M "dot" n, where n is the normal to the interface surface. Positive magnetic charges 34, therefore, appear at the edge 30 of the element 16', and negative charges 36 appear at the edge 32. These charges give rise to a longitudinal demagnetizing field 38 which, by opposing the longitudinal component 40 of the magnetization 24, acts as a destabilizing influence tending to destroy the single domain magnetization in favor of a lower energy multidomain structure. Narrow width elements are particularly susceptible to this destabilization due to the larger field resulting from the decreased separation of the positive charges 34 from the negative charges 36.

There is a second effect contributing to the tendency of the single domain magnetization to convert to a multidomain configuration in the rectangular element. Referring to FIG. 2b, it will be appreciated that under conditions where a strong signal field 29' is applied to the element 16', the magnetization 24 is further rotated so as to reduce the magnitude of the magnetization longitudinal component 40. The magnetization 24 is shown for the case where it has been rotated by a strong signal field 29' completely into line with the hard axis 20', effectively eliminating the longitudinal component of the magnetization 24. It is known in the art that the magnetization will lie equally well in either direction along the easy axis. Under the above described conditions, when the longitudinal component of the magnetization approaches zero the magnetization is particularly vulnerable to the effects of perturbing fields. A perturbing field, such as the earth's magnetic field, if directed opposite to the original direction of the magnetization along the longitudinal axis can reverse the direction of the longitudinal component of the magnetization direction because there is no longer a restraining residual longitudinal component present in the domain. Additionally, when the strong signal 29' is eventually reduced in amplitude to a lower value, say, 29" the conditions of FIG. 2c may obtain. Inevitable, small local variations in the easy axis anisotropy characteristics may cause the single domain of the film 16' to split into multiple domains 42, 44, 46, whose magnetizations 48, 50, 52, have longitudinal components which lie in opposite directions to each other along the easy axis 18'. Subsequently, the walls 54, 56 of the domains 42, 44, 46, can undergo wall state transitions which generate Barkhausen noise detrimental to the SNR of the device incorporating the film.

In prior art films, it has been the practice to use external means to provide a small biasing field along the easy axis in the desired magnetization direction to improve the stability of the domain magnetization. Referring to FIG. 2d, a magnet 58 whose field lines 60 intercept the element 16' in the correct direction along the easy axis 18' provides improved stabilization against the effects described above.

SUMMARY OF THE INVENTION

The present invention provides increased stabilization of the magnetization of a single domain thin magnetic element over that attainable in the rectangular thin element known in the prior art by shaping the magnetic element as a rhomboid rather than as a rectangle. Practice of the invention teaches angling the transverse sides of the film with respect to the longitudinal sides either at an angle equal to, or smaller than, the angle at the bias point of the magnetization with respect to the direction of the easy axis, as established by an external bias field. Under these conditions the biased magnetization of the film, being either parallel to, or at a positive angle with respect to the transverse sides of the rhomboid, either generates no charges at the transverse edges of the film, or actually generates charges which produce a field parallel to the longitudinal component of the magnetization which stabilizes the magnetization of the single domain rather than destabilizes it.

DESCRIPTION OF THE INVENTION

The improved stabilization of the magnetization of an element according to the present invention may be understood by first referring to FIG. 3a. In a preferred embodiment, a single domain magnetoresistive element 62, (shown deposited on a non-magnetic substrate 65), is in the form of a rhomboid, with longitudinal edges 64, 66 and transverse edges 68, 70; the element easy axis 51 lying along the line of the longitudinal edges 64, 66. The acute angle 63 between the transverse edge 68 and longitudinal edge 64 (and the equal corresponding angle 61) have the approximate values of 45 degrees—the same value of the angle 72 that the magnetization 74 makes with the easy axis 51 of the element 62 as biased by an external field 76 along the hard axis 78. It will be noted that the magnetization vector 74 is now parallel to the edges 68, 70 and therefore the vector "dot" product between the magnetization and the normals to the edges 68, 70 is now zero, i.e. there are no charges generated at the interface edges of the film. No longitudinal demagnetizing field, therefore, is generated opposing, and destabilizing, the longitudinal component of the magnetization 74, and the magnetization stability is enhanced.

Referring now to FIG. 3b, the operation of the element according to the invention is illustrated for the case where a signal field 80 rotates the magnetization 74' so the angle 72' between the magnetization and the easy axis 51 is 90 degrees and the magnetization 74' is in the direction of the hard axis 78. Under these conditions, the magnetization 74' is no longer parallel to the element edges 68, 70 and negative magnetic charges 82 appear at the interface edge 68 while positive magnetic charges 84 appear the interface edge 70. These charges give rise to an internal magnetic field 86, directed from the positive charges 84 to the negative charges 86, which unlike the prior art, is now in the same direction as the longitudinal component of the original magnetization 74, and which stabilizes (without the necessity of any external easy axis biasing means), rather than destabilizes, the magnetization 74.

It will be appreciated that FIG. 3b illustrates the extreme case where the magnetization 74' has been rotated into the line of the hard axis 78 by a positive signal 80. The stabilizing charges 82, 84 appear for all positive (as previously defined above) rotations of the magnetization due to positive signals. A negtive signal, on the other hand, will rotate the magnetization 74' in the opposite direction, and will give rise to charges of signs opposite to those illustrated for the stabilizing charges 82, 84. The destabilizing effect of these charges, however, will be less than would occur in the corresponding rectangular film. Because in normal operation, the signal variation results in only small angular variations of the magnetization about the bias point, the bias angle 72 is preferably set at a more positive value than the rhomboid angle 63, rather than equal to the angle 63. Referring to FIG. 3c, it will be seen that positive rotation of the magnetization relative to the transverse side of the rhomboid when biasing the element results in stabilizing charges being present for the no signal condition, i.e. at the quiescent bias point. Therefore, stabilization is available for both positive and negative small signal variations about the bias point.

In a second preferred embodiment of the invention, a thin magnetoresistive film element, such as permalloy employed as the magnetic field detector, is incorporated into a magnetoresistive reproduce head as illustrated in FIG. 4. (For the sake of clarity, the relative dimensions of the elements of the head of FIG. 4 are distorted to more clearly show the invention. For example, the magnetoresistive element 90 is actually extremely small compared to the magnet 102, and the magnet 102 is, in reality, very much further removed from the element 90 than can be portrayed in the figure.) A thin film single domain magnetoresistive element 90, mounted on a substrate 92, has a rhombic shape with transverse edges 94, 96 at approximately 45 degrees to the longitudinal edges 98, 100. The element 90 is fabricated with an easy axis laying along the longitudinal direction, and a hard axis perpendicular to the easy axis. A permanent magnet 102 mounted in a cover plate 104, is coupled to the magnetoresistive element 90 providing a bias field 106 along the hard axis. The bias field 106 rotates the magnetization of the element 90 through a positive angle slightly greater than 45 degrees to the longitudinal sides 98, 100 of the element 90 to provide a stabilizing longitudinal field. As previously described, the rhombic shape of the element 90 provides the stabilizing effect which maintains the element 90 as a single domain film with the attendant reduction of incipient domain wall movement induced noise.

The head of FIG. 4 is adapted to intercept signal field lines from a cooperative recorded magnetic tape in contact with the longitudinal edge 100 of the element 90, in the manner known in the art. These signal field lines modulate the bias angle of the magnetization and varies the element 90 resistance which is detected by the voltage drop caused by a sense current 108 adapted to flow in the film 90. Leads 107, 109, for carrying the current 108 into and out of the element 90 are attached to the element 90 so that the regions of lead/magnetoresistive element contact are congruent, and so that the edges of the leads 107, 109 are perpendicular to the longitudinal sides 98, 100 of the element 90. Resultantly, the sense current distribution arising from the current 108 is uniform through the element 90.

The invention has been described in detail with particular reference to preferred embodiments thereof, but it will be understood that variations and modifications can be effected within the spirit and scope of the invention. In the described embodiments, the angle of the transverse sides of the rhombic element with respect to the longitudinal edge has optimally been established at about 45 degrees. This optimum value is determined by the relationship between the value of the magnetization angle set by the bias field and the angle of the rhombic element, as previously described. It will be understood that the angle of the rhomboid may be varied over a wide range, however, for example, from 30 to 60 degrees while still realizing the advantages taught by the invention. The limitation on the rhombic angle is set by the limitation on the corresponding angle of the magnetization of the element i.e. by the biasing condition of the magnetoresistive element which allows acceptable performance with respect to linearity and harmonic distortion in signal detection by the element, as is known in the art.

What is claimed is:

1. An improved magnetoresistive reproduce head for playback of magnetically recorded information from a magnetic medium, the improvement comprising:

a. a magnetoresistive thin film element deposited on a non-magnetic substrate, said element being geometrically shaped as a rhomboid, whereby the magnetization of said single domain magnetoresistive element is stabilized against noise inducing domain wall formation.

2. The improved magnetoresistive reproduce head of claim 1 wherein said thin film element is of permalloy.

3. The improved magnetoresistive reproduce head of claim 2 wherein said element is a single magnetic domain.

* * * * *